United States Patent [19]

Bosiers et al.

[11] Patent Number: 5,442,208
[45] Date of Patent: Aug. 15, 1995

[54] CHARGE-COUPLED DEVICE HAVING CHARGE RESET

[75] Inventors: Jan T. J. Bosiers; Edwin Roks; Agnes C. M. Kleimann, all of Eindhoven, Netherlands

[73] Assignee: U.S. Philips Corporation, New York, N.Y.

[21] Appl. No.: 359,326

[22] Filed: Dec. 16, 1994

Related U.S. Application Data

[63] Continuation of Ser. No. 164,233, Dec. 8, 1993, abandoned.

[30] Foreign Application Priority Data

Dec. 9, 1992 [EP] European Pat. Off. ............ 92203825

[51] Int. Cl.⁶ .................... H01L 29/78; H01L 27/14; H01L 31/00
[52] U.S. Cl. .................... 257/223; 257/220; 257/221; 257/230; 377/62
[58] Field of Search ............ 257/218, 219, 220, 221, 257/223, 227, 230; 377/61, 58, 62, 63

[56] References Cited

U.S. PATENT DOCUMENTS

| | | | |
|---|---|---|---|
| 4,485,315 | 11/1984 | Collet et al. ................. | 257/224 |
| 4,649,023 | 3/1987 | Sabol et al. . | |
| 4,748,486 | 5/1988 | Miyataka ..................... | 257/223 |
| 4,769,709 | 9/1988 | Van De Steeg .............. | 358/213.19 |
| 4,814,848 | 3/1989 | Akimoto et al. ............. | 257/223 |
| 4,977,584 | 12/1990 | Kohno et al. ................ | 257/223 |
| 5,008,758 | 4/1991 | Burke ........................... | 257/222 |
| 5,019,333 | 5/1991 | Isobe et al. . | |
| 5,115,458 | 5/1992 | Burkey et al. ............... | 377/58 |
| 5,125,985 | 6/1992 | Foster et al. . | |
| 5,134,453 | 7/1992 | Sankaranarayanan ....... | 377/61 |

FOREIGN PATENT DOCUMENTS

| | | | |
|---|---|---|---|
| 0143496 | 6/1985 | European Pat. Off. ............ | 257/230 |
| 415134 | 3/1991 | European Pat. Off. . | |
| 59-33865 | 2/1984 | Japan ................................. | 257/230 |
| 62-147767 | 7/1987 | Japan ................................. | 257/230 |
| 3-25974 | 2/1991 | Japan ................................. | 257/223 |
| 2054961 | 2/1981 | United Kingdom ................ | 257/223 |

OTHER PUBLICATIONS

"1GHz CCD Transient Detector" L. Sankaranarayanan et al, IEDM '91, Digest pp. 179–182.

*Primary Examiner*—Ngân V. Ngô
*Attorney, Agent, or Firm*—Steven R. Biren

[57] ABSTRACT

It is known to reduce the leakage current or dark current in charge-coupled devices with buried channels such as, for example, charge-coupled imaging devices by bringing the surface to the inverted state. In such a device, however, it is not possible to empty the channel completely locally in usual manner in that the charge is drained off through the substrate by means of a voltage pulse applied to the gates (charge reset). To be able to carry out charge reset nevertheless, the voltage pulse is applied between the substrate and the intermediate zone interposed between the substrate and the CCD channel. Since this voltage pulse is active over the entire range of the device, the device also prevents charge from being removed in locations where this is not desired when the pulse is applied. It is possible in this manner to carry out charge reset, for example, in the imaging section only, in imaging devices without removing the information which is simultaneously in store in the memory section and/or in the read-out register.

5 Claims, 3 Drawing Sheets

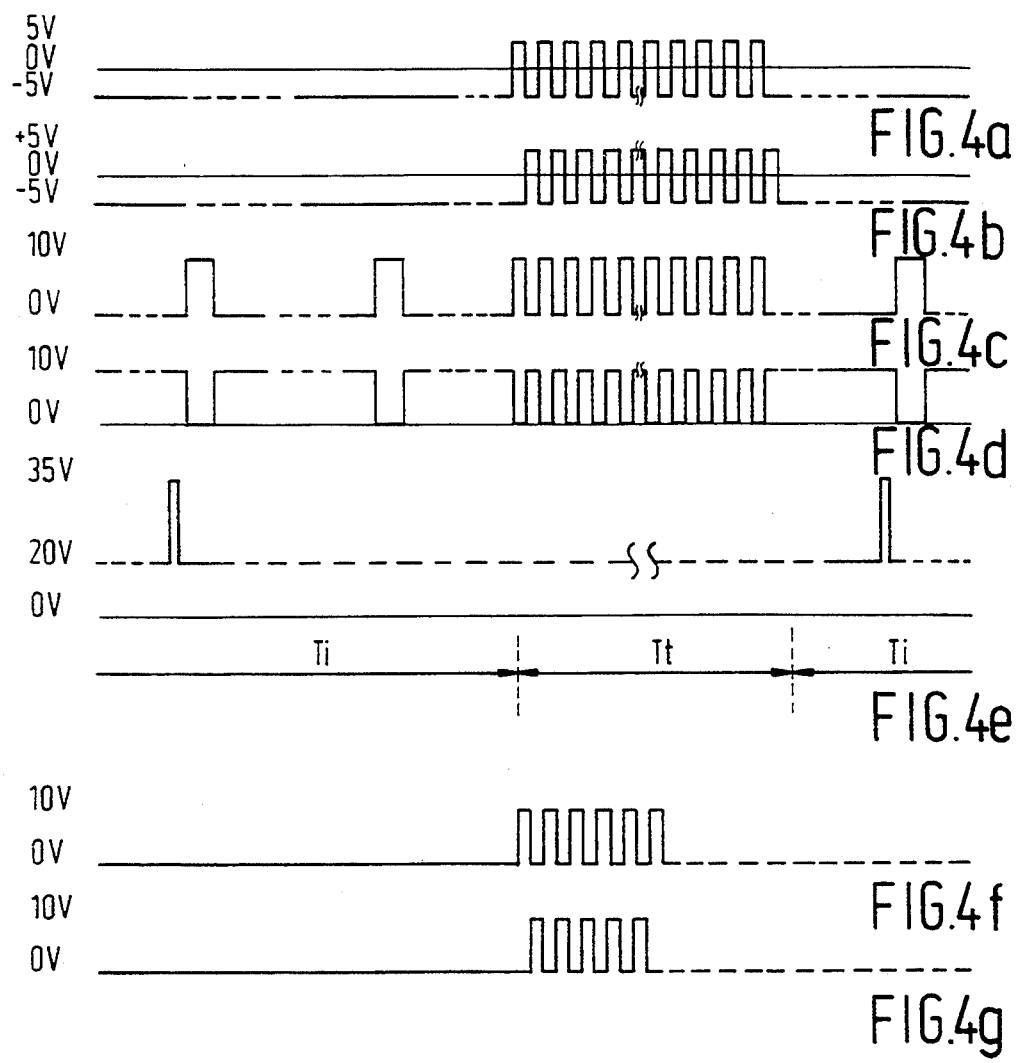
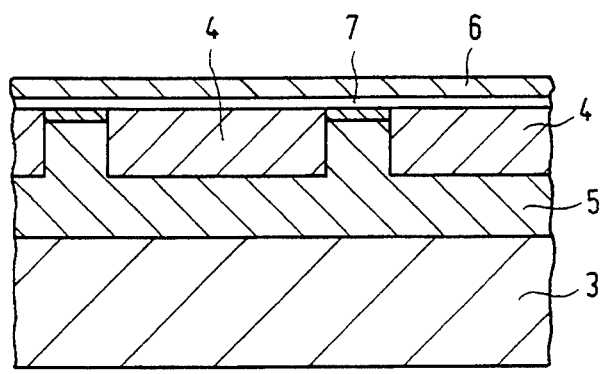
FIG.5

CHARGE-COUPLED DEVICE HAVING CHARGE RESET

This is a continuation of application Ser. No. 08/164,233, filed Dec. 8, 1993, now abandoned

BACKGROUND OF THE INVENTION

The invention relates to a charge-coupled device of the buried-channel type comprising a semiconductor substrate of a first conductivity type which is provided at a surface with a zone of the first conductivity type for storage and transport of packages of electric charge carders from a first charge storage location to a second charge storage location, which zone is separated from the substrate of the first conductivity type by an interposed zone of the second conductivity type opposite to the first, while the surface is provided with a system of electrodes for applying clock voltages separated from the buried channel by an interposed dielectric layer and connected to a voltage source by means of which voltages are applied, an inversion layer of the second conductivity type being formed below the system of electrodes at the interface between the buried channel and the dielectric layer. The invention also relates to a method of operating such a device. Such a device is known, for example, from U.S. Pat. No. 5,115,458.

Charge-coupled devices or CCDs are generally known nowadays and have various fields of application. The main application is in cameras, both for professional purposes and for consumer purposes, in which the charge-coupled device is used as an image transducer by which a projected radiation image is converted into electrical signals. Although the invention should not be regarded as limited to image transducers, it is indeed explained below with reference to image transducers because of the particular advantages obtained in this CCD application through the invention. It will be perfectly obvious, however, that the invention also offers major advantages in other applications.

The three-layer construction with a substrate and a buried CCD channel of the one conductivity type, for example the n-type, separated from one another by an interposed region of the p-type in image transducers has the advantage that the excess charge caused by overexposure can be drained off through the substrate (vertical antiblooming) and that the exposure time, if so desired, may be adjusted in that charge generated during a certain portion of the maximum exposure time is drained off through the substrate (charge reset). An alternative CCD type with a three-layer construction is described inter alia in the article "1 GHz CCD transient detector" by Sankaranarayanan et al., presented at the IEDM '91, digest pp. 179/182. This relates to a high-frequency shift register with parallel channels in which excess charge packages are drained off through the substrate during demultiplexing.

It is generally known that in charge-coupled devices electrical signals are formed by packages of electric charge carriers which are stored in a depletion region induced at the surface. These packages comprise not only a signal component but also a component not equal to zero which is caused by leakage currents or dark currents. The generation of these leakage currents takes place for the major part in the depletion region, and in particular at the surface where the concentration of defects and of the accompanying states in the forbidden band in the energy diagram is comparatively high at the interface between the semiconductor and the gate dielectric. It is desirable to keep the dark currents as low as possible in general for reasons which are apparent per se such as, for example, the dynamic range of the signals or the maximum time during which a signal can be stored without regeneration.

The distribution of surface states is usually not uniform over the surface of the device, which means that the leakage currents may vary strongly depending on location. When the device is used as a shift register, in which the charge packages are stored in the various charge storage locations for approximately equal periods, these non-uniformities of the leakage current are more or less averaged out, whereby the various charge packages have each integrated an approximately equal leakage current at the output of the register, which can be compensated for through shifting of the DC level of the read-out signals. In a CCD image transducer, for example of the FT type, the pattern of charge packages is not moved during a comparatively long integration period in which the image is detected and convened into discrete charge packages. After the integration period, the charge pattern formed is transported to a memory section in a comparatively very short time. Since each charge package is stored in a given charge storage location acting as an image transducer element for a comparatively long time and during a much shorter time in other charge storage locations during transport, the said averaging-out of the leakage current over a large number of charge storage locations does not take place. This means that the non-uniformity of the leakage current becomes visible on a display screen (fixed pattern noise or FPN) when the converted image is displayed on this screen. In the case of a local defect, the dark current may lead to a complete filling of the relevant charge storage location with charge also without absorption of electromagnetic radiation, which results in a very unpleasant white spot on the display screen.

The cited U.S. Pat. No. 5,115,458 discloses an n-channel CCD image transducer in which the clock electrodes are set to such a low voltage during the integration time that the surface below the clock electrodes is inverted, a layer of holes being stored at the interface. As is described in the U.S. Patent, the dark current is substantially entirely suppressed, at least in as far as it results from surface states, because the surface is now no longer depleted.

In an embodiment of the known device having an n-type channel in a p-type zone provided in an n-type substrate, an excess charge caused by overexposure can be drained off through the substrate in the manner described above. Problems arise, however, in the case of the charge reset also described above owing to the inversion of the surface. The obvious method of removing all charge from the imaging section is to apply a negative voltage pulse to the clock electrodes of the imaging section whereby the electrons are "pushed" into the substrate, which itself was set for a positive bias voltage. This method cannot be used, however, in combination with the dark current reduction described because the surface potential is pinned to the voltage value of the p-type zone bounding the n-type channel by the inversion layer. A reduction of the gate voltage further than the threshold voltage will not or hardly cause the surface potential to drop further, so that it is impossible to remove the electrons.

SUMMARY OF THE INVENTION

The invention has fir its object inter alia to provide a charge-coupled device with a buried channel in which the dark current or leakage current is kept at a very low level through inversion of the surface, and which offers the possibility of charge reset through the substrate. The invention also has for its object to provide a charge-coupled imaging device, in particular of the frame transfer type (FT type), with a low dark current and/or a low FPN and with an exposure time which can be adjusted by means of charge reset.

According to the invention, a charge-coupled device of the kind mentioned in the opening paragraph is characterized in that the device is provided with charge reset means by which charge can be drained off from charge storage locations through the substrate by the application of a voltage pulse, which means comprise a voltage source connected to the substrate and/or the interposed zone, charge being drained off through the substrate from only a portion of the charge storage locations and means being present which prevent that simultaneously charge is drained off through the substrate from other charge storage locations. Voltages are applied to the various regions during operation such that the CCD channels are separated from the substrate by a potential barrier formed by the interposed p-type region. This barrier can be so reduced by the voltage pulse between the substrate and the interposed zone that electrons flow from the CCD channels to the substrate. However, since the substrate and/or the interposed zone, for example in the case of an FT transducer, is/are common to the imaging section, the memory section and the horizontal read-out register, the application of a pulse without further measures could erase not only the imaging section but also the memory section, which may at that moment be filled with useful information, and/or the read-out register. This disadvantage is counteracted in a device according to the invention in that differences are provided between the various portions of the transducer such that the applied pulse is effective locally only in the transducer, for example in the imaging section only, and is not carried over to other sections, for example the memory section of an FT transducer. This renders it possible, for example, again in the example of an FT transducer, to reset the imaging section, for example for reducing the exposure time, while a frame of image information is stored in the memory section for further processing.

In an embodiment, the interposed zone is connected to a constant potential and the voltage pulse is supplied to the substrate. In alternative embodiments, the substrate may be at a fixed potential while the reset pulse is supplied to the interposed zone.

Although the invention can be used to advantage in charge-coupled devices for signal processing such as delay lines, filters, memories, etc., the above renders it clear that particular advantages are obtained when the device forms a two-dimensional imaging device comprising a number of registers with buried channels situated next to one another in which a pattern of charge packages corresponding to a radiation image projected on the device can be generated during an integration period and subsequently transported to a parallel-in, serial-out read-out register. The image transducer may be of any type which is known per se, for example, of the interline type. An embodiment for which the invention is particularly relevant because, as was noted above, each charge package is stored in a certain charge storage location for a long time in this type of transducer and only for a short time in other charge storage locations, so that no avenging of the dark current over the various charge packages takes place, is characterized in that the imaging device is of the frame transfer type in which between the said system of registers situated next to one another, which forms an imaging section converting a radiation image into a pattern of charge packages, and the read-out register a second system of registers situated next to one another is present, which latter registers are connected on the one hand to the read-out register and on the other hand to the registers of the imaging section, the second system forming a memory section for the temporary storage of a pattern of charge packages generated in the imaging section. To ensure that the reset pulse is effective in the imaging section and not in the memory section, a further embodiment of such an FT transducer is characterized in that the electrode systems of the imaging section and of the memory section are each connected to a clock voltage source for applying clock voltages, the clock voltages applied to the electrodes of the imaging section during the integration period being lower in the case of an n-channel device or higher in the case of a p-channel device than the corresponding clock voltages applied to the electrodes of the memory section. The voltage difference between the electrodes of the imaging section and of the memory section in this embodiment achieves that the potential wells in the memory section are deeper than those in the imaging section, whereby, for example in the case of an increasing substrate voltage, charge from the imaging section only is removed, and not the charge in the memory section. Owing to the higher voltage (in the case of an n-channel CCD) it is possible for the surface in the memory section not to be inverted, so that the dark current in the memory section may have a higher value than in the imaging section. This disadvantage is counteracted at least partly in that the charge packages in the memory section are not stored in a given storage location for a disproportionately long period, but are regularly transported from one storage location to a next one, whereby any local peaks in the dark current are evened out over the various charge packages. Another embodiment of an FT imaging device according to the invention, in which the surface can be inverted for decreasing the dark current also in the memory section, is characterized in that the electrode systems of the imaging section and of the memory section are each connected to a voltage source for applying clock voltages, the clock voltages applied to the electrodes of the imaging section during the integration period having the same amplitudes as the clock voltages applied to the memory section except in those periods in which a reset pulse is applied, in which case a voltage is applied to the electrodes of the memory section below which a charge package is stored at which no inversion occurs anymore at the surface. In this embodiment, accordingly, it is indeed necessary to change the level of the clock voltages in the memory section ,during a reset pulse in order to prevent charge being drained away from the memory section during resetting.

A further embodiment of an FT imaging device according to the invention is characterized in that the minimum value of the doping concentration per unit area of the interposed zone of the second conductivity type below the buried-channel registers in the memory section is higher than below the buried-channel registers in the imaging section. The selectivity in the charge removal is obtained here by inherent differences, in this case a difference in doping level, between the imaging section and the memory section or read-out register. Such a measure may be advantageously applied in combination with the differences in clock voltage levels referred to above between the imaging section and the memory section.

A preferred embodiment of a charge-coupled imaging device according to the invention, which has among its advantages that crosstalk of the substrate pulse to the output signals is prevented as much as possible, is characterized in that the reset pulse is supplied to the substrate in a period lying between reading-out of a final charge package of a first line of charge packages by the read-out register and reading-out of the first charge package of a second line of charge packages following said first line.

BRIEF DESCRIPTION OF THE DRAWING

The invention will be explained in more detail with reference to a several embodiments and the accompanying diagrammatic drawing, in which:

FIG. 4a–e is a diagram of the clock voltages applied to this device;

FIG. 4f–g is a diagram of clock voltages in a second embodiment of a device according to the invention; and FIG. 5 is a cross-section of a third embodiment of a device according to the invention. It is noted that the drawing is diagrammatic and not true to scale.

DESCRIPTION OF THE PREFERRED EMBODIMENTS

Figure 1:
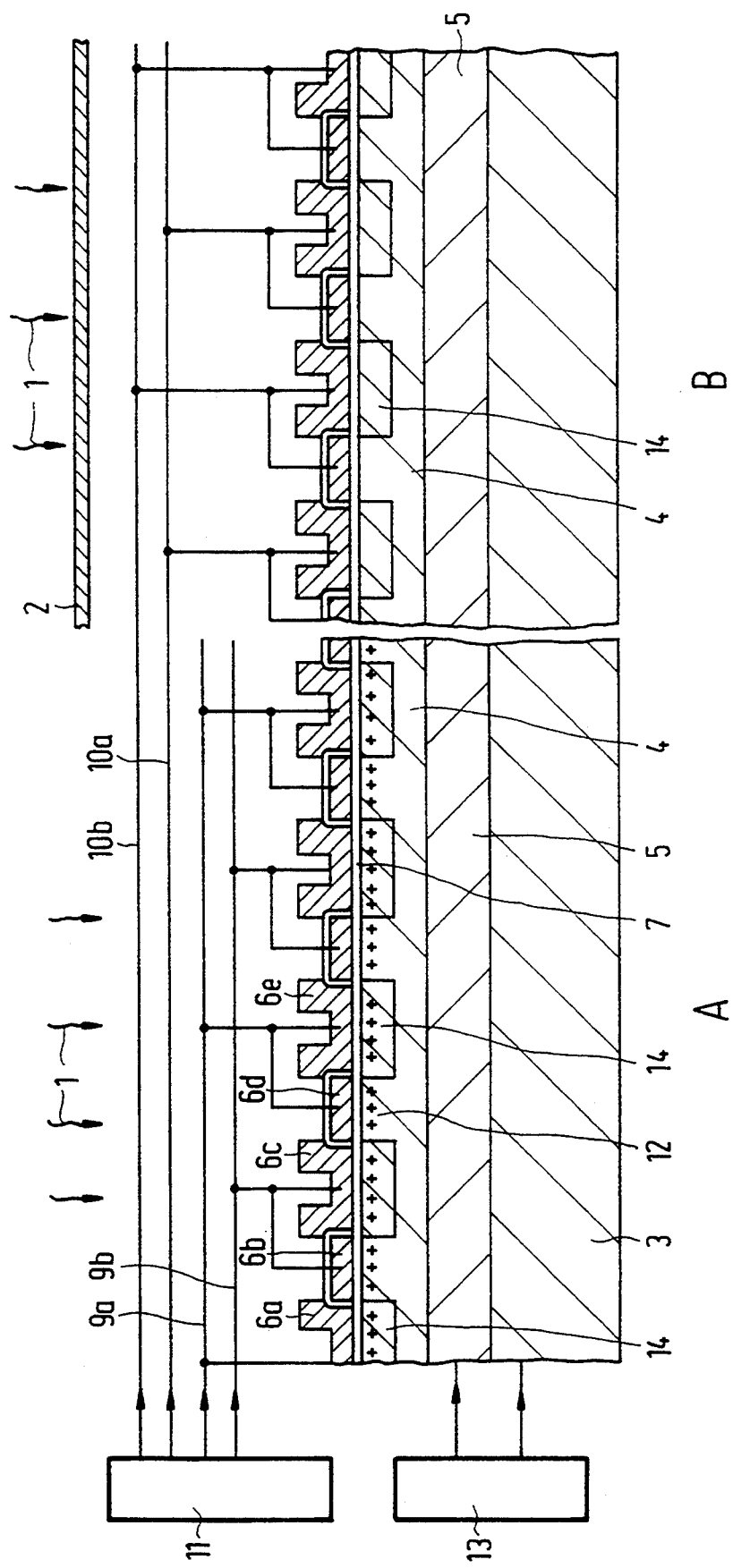
FIG. 1 is a cross-section of a charge-coupled imaging device according to the invention.

FIG. 1 is a cross-section taken parallel to the transport direction of a charge-coupled device according to the invention which together with a number of adjacent similar devices can be used as an imaging device of the FT (frame transfer) type. The device comprises an imaging section A onto which a radiation image represented by photons 1 can be projected and which converts the radiation image into a pattern of discrete charge packages. The value of each of these electric charge packages is a measure for the intensity of the locally captured radiation. The device further comprises a memory section B and a read-out register not shown in the drawing. The memory section is masked from incident radiation by a diagrammatically depicted light screen 2 and serves, as is generally known, for the storage of the charge patterns generated in the imaging section A. The device is of the buried-channel type and comprises a semiconductor substrate 3, for example made of silicon, of a first conductivity type, for example the n-type. The silicon substrate 3 is provided at its surface with a zone or region 4 of the same conductivity type as the substrate, so of the n-type, which is separated from the remaining portion of the n-type substrate at its lower side by an interposed zone 5 of the opposite conductivity type, so of the p-type. As is known, excess charge can be drained away from the transport channel 4 through the substrate in such a vertical npn configuration. The removal of the charge generated during a certain portion of the maximum integration time (charge reset) renders it possible, for example, to control the effective exposure time. In view of this charge removal, the layer 5 has such a composition that a depletion region is formed during operation which extends over the entire distance between the substrate 3 and the transport layer 4. To obtain a suitable potential barrier between the substrate and the region 4, the interposed region 5 is so provided that a constriction 8 (FIG. 2) is formed below the channel 4 in the region 5, so that the potential barrier is locally lower than in adjoining, thicker portions of the p-type interposed region 5.

The surface of the device is provided with an electrode system in the usual manner, comprising the overlapping electrodes 6a, 6b, 6c, etc. provided in a 2-layer wiring and separated from the silicon surface by the thin gate dielectric layer 7. The electrodes 6 of the imaging section A and of the memory section B are connected to a voltage source 11 through connections or clock lines 9 and 10, respectively. The voltages applied to the electrodes 6 of the imaging section during the integration periods (during which an image is converted into a pattern of charge packages) are such that the surface of the channel coinciding with the interface between the dielectric layer 7 and the silicon of the channel 4 enters a state of inversion, i.e. a state in which a layer of holes is present at the interface. The inversion layer is diagrammatically depicted in FIG. 1 with the +signs 12. As was noted in the introduction, electrons generated by surface states recombine with holes in the inversion layer 12 so that a strong reduction of the dark current (leakage current), which is mainly formed by surface generation, is achieved.

The usual charge-resetting method, i.e. driving electrons from the imaging section into the substrate 3 by means of a negative voltage pulse at the gates of the imaging section, is not possible owing to the inversion at the surface by which the surface voltage is pinned to a certain value. The device according to the invention is therefore provided with charge reset means 13 comprising a voltage source connected to the substrate 3. By applying a positive voltage pulse to the substrate, it is possible to reduce the potential barrier in the p-type interposed region 5 to such an extent that electrons flow from a portion of the n-type transport layer 4, more precisely from the imaging section A, to the substrate. Since the substrate is common to the imaging section, the memory section and the output register (not shown), means are additionally provided by which it is prevented that charge is simultaneously drained off from other portions of the device, for example from the memory section B and/or the output register, upon the application of a substrate pulse. In the embodiment described here, these means comprise the clock voltage source 11 by means of which lower voltages are applied to the electrodes 6 of the imaging section A than to the electrodes 6 of the memory section B and to the clock electrodes of the read-out register. The voltages at the gates of the imaging section are chosen to be so low in this case that inversion occurs below the gates. The voltages at the gates of the memory section, at least those gates below which signals are stored, are chosen to be so high that no inversion occurs below these gates. Potential wells are induced below these gates thereby which are deeper than those below corresponding charge storage gates in the imaging section and which remain intact also in the case of a substrate pulse, as will become apparent from the description of the operation of the device.

The above obviously also holds for p-channel charge-coupled devices in which the polarities of the voltages are to be inverted compared with the n-channel device described here.

Figure 2:
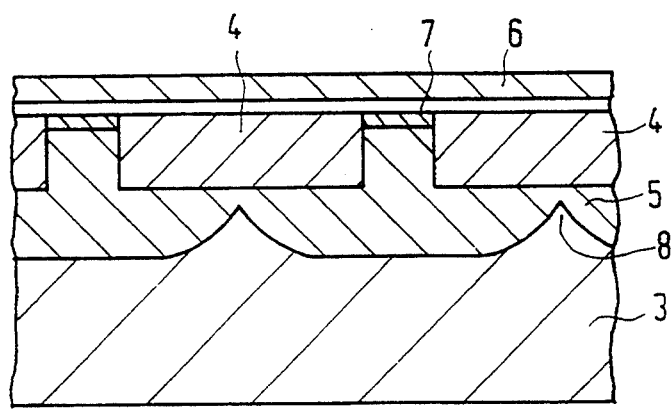
FIG. 2 is a cross-section of the same device in a plane perpendicular to the transport direction.

In a realized embodiment, a substrate 3 was used with a substrate doping of approximately $4 \times 10^{14}$ atoms.cm$^{-3}$. The p-type zones 5 were formed by implantation of boron with a dose of approximately $1.1 \times 10^{12}$ at.cm$^{-2}$. The maximum depth of the zones 5 was approximately 2.2 $\mu$m. To prevent n-type inversion channels being formed in the p-type zones 5 at the surface and to achieve that there will be a sufficient number of holes for forming an inversion layer in the CCD channels, the p-doping at the surface between the zones 4 is somewhat increased by means of an extra implantation (FIG. 2). The CCD channels 4 are formed by an n-implantation with a dose of $0.9 \times 10^{12}$ at.cm$^{-2}$. The depth of the zones 4 was approximately 1.0 $\mu$m. To obtain a potential profile of wells and barriers also in the situation in which the surface is in the inverted state, whereby the surface potential in fact is pinned to a certain value and accordingly practically does not change any more when the voltage is further decreased, an extra n-type doping is provided in the zones 14 within the n-zones 4 through implantation with a dose of $8.0 \times 10^{12}$ at.cm$^{-2}$. The zones 14 are provided at every other gate electrode, so that the device can be operated as a 2-phase CCD, each gate having a subjacent zone 14 being connected to a preceding gate without a zone 14. During operation, the extra n-doping in the zones 14 causes an extra positive potential whereby in the case of, for example, equal voltages at the gates 6d and 6e, a potential well is formed below the gate 6e where charge can be stored. It will be obvious that alternative methods known per se and combinations of such methods for creating a non-uniform potential below the gate electrodes may be used, such as the use of a gate dielectric of a non-uniform thickness. It is also possible to provide a p-type doping at the areas of the potential barriers, whereby the net concentration of the n-type impurity is locally reduced, instead of an extra n-doping at the areas of potential wells. The gate dielectric 7 is formed by a layer of silicon oxide of approximately 100 nm thickness. The gate electrodes 6 are provided in a 2-layer wiring of polycrystalline silicon, referred to as poly 1 and poly 2 hereinafter. The gates in poly 1 (lower poly layer) are situated, seen at the surface, between the more highly doped n-zones 14 which can be provided in a self-aligning manner known per se relative to these gates after the definition of the poly 1 gates. After the implantation of the zones 14, the gates in the poly 2 layer, which are situated over the zones 14 and accordingly act as storage gates, are provided. The poly layers are mutually separated by an interposed interpoly dielectric, for example in the form of an oxide layer. A usual glass layer (not shown in the drawing) is provided over the entire construction, with contact openings through which the gates are connected to the clock lines 9 and 10.

The construction of the device in the present embodiment is practically the same for the imaging section and the memory section in the sense that the cross-section according to FIG. 2 could be made both in the imaging section and in the memory section. In a first operating mode, the voltages are applied to the device as shown in FIG. 4 as a function of time. A voltage of, for example, 20 V is applied to the substrate 3, and increased to 35 V during resetting (FIG. 4a). A voltage of 5 V is applied to the p-region 5 between the substrate and the CCD channels, which corresponds to the surface potential in the more highly doped p-zones between the CCD channels. The clock voltages drawn in FIGS. 4a and 4b are applied to the gates 6 of the imaging section through the clock lines 9a and 9b, respectively. The clock voltages drawn in FIGS. 4c and 4d are applied to the gates 6 of the memory section through the clock lines 10a and 10b, respectively. FIG. 4 in addition shows a time interval $T_t$ and intervals $T_i$. During the transport time $T_t$, a charge pattern formed in the imaging section is transported from the imaging section to the memory section, while in the integration time $T_i$ a new radiation image is captured in the imaging section while a previous image, stored in the memory section, is read out.

Given the doping levels and oxide thicknesses of the gate dielectric 7 mentioned here, the threshold voltage at which p-inversion channels are formed at the surface in the CCD channels at the areas of the more highly doped n-zones is approximately 9 V. The threshold voltage is lower in the regions between the zones 14 owing to the lower n-doping. A voltage of $-5$ V is applied to the gates 6 of the imaging section during the integration period $T_i$. The 5 V at the p-zone 5 then inverts the entire surface in the CCD channels of the imaging section and pins it to a potential of approximately 5 V. Owing to the doping profile in the CCD channels, a potential profile of potential wells at the more highly doped zones 14 alternating with potential barriers in which the generated electrons are integrated into charge packages is created in these channels at a distance from the surface. Simultaneously, information stored in the memory section can be read out, for which purpose clock voltages between 0 and 10 V are applied to the gates 6 of the memory section for 2-phase transport to the output register. No inversion occurs at these voltages, which will mean in general that the dark current is slightly greater in the memory section. As was noted above, this dark current is less disadvantageous here than in the imaging section because peaks in the dark current are averaged out over an entire column by the charge transport. A voltage of 20 V is applied to the substrate, whereby the pn junction between the n-substrate 3 and the p-zone 5 is reverse biased.

Figure 3:
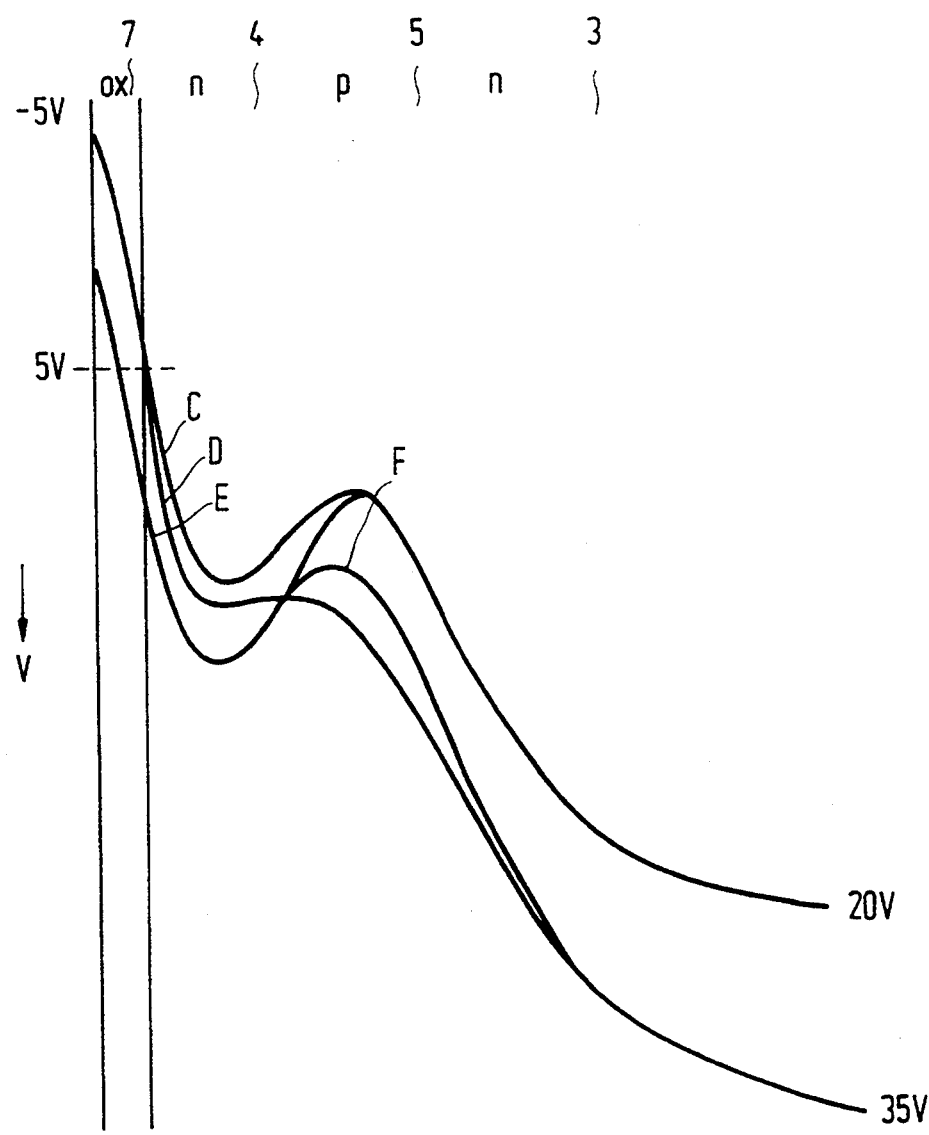
FIG. 3 shows a potential profile in a direction perpendicular to the surface during operation of this device.

To clarify the operation of the device, a number of potential profiles in a direction transverse to the surface are drawn in FIG. 3 for various gate voltages and substrate voltages at the area of a more highly doped zone 14. For a correct understanding it is noted that the (positive) potential is plotted in downward direction. The Figure also shows the gate oxide layer 7, the CCD channel 4, the p-region 5 and the substrate 3. Curve C shows the situation at a gate voltage of 5 V and a substrate voltage of 20 V. A potential minimum is formed in the channel 4 in which charge can be stored and which is separated from the substrate by a barrier in the p-region 5 as long as the charge quantity does not exceed a certain maximum. This property is employed in imaging devices, as is generally known, for preventing blooming in the case of overexposure. As is shown in FIG. 3, the potential at the barrier in the p-region 5 may be higher than 5 V owing to the fields induced in the fully depleted portion of the p-region 5 situated between the CCD channel and the substrate. When the charge generated during a portion of the integration period is to be removed (charge reset), for example for adjusting the effective exposure time, a pulse of 35 V is applied to the substrate, as is shown in FIG. 4. Curve C then merges into curve D, in which the barrier in the p-region 5 has disappeared entirely or at least substantially entirely, so that the electrons which were stored in the well of curve C are drained off through the substrate 3. When the substrate voltage is restored to 20 V again, curve C is obtained again at the gate voltage of 5 V with a potential well in which charge can again be integrated. A potential profile in accordance with curve E is obtained at a higher gate voltage. The surface potential is higher than 5 V, so that no inversion takes place at the surface. The potential well in the CCD channel 4 is deeper here than in curve C. When the substrate pulse of 35 V is applied at this gate voltage, whereby curve E merges into curve F, a sufficiently high barrier can remain in the p-region 5 for preventing charge transport to the substrate. This means that charge will be drained away from the imaging section A only in the case of a 35 V substrate pulse, and that the information captured during the preceding integration period remains in the memory section B.

During the integration time $T_i$, the charge in the memory section is transported to the output register in a 2-phase transport. The clock voltages used for this are shown in FIGS. 4c and 4d. These voltages alternate between the levels 0 V and 10 V. No inversion takes place at the surface during this, which is favorable for charge transport. Preferably, this charge transport takes place, as does the charge removal from the imaging section, by means of the substrate pulse in a period between reading-out of two consecutive lines of charge packages via the output register. Crosstalk of the substrate pulse or reset pulse on the output of the device can be limited in an advantageous manner thereby.

When the integration period $T_i$ has elapsed and the memory section B is empty, the pattern of charge packages generated in the imaging section A is transferred to the memory section. Comparatively high-frequency, 2-phase clock voltages are supplied to the gates 6 of both the imaging section A and the memory section B through the clock lines 9 and 10 for the purpose of this transfer during the transport time $T_t$. In the embodiment of FIGS. 4a and 4b, the levels of the various clock voltages are not changed, i.e. the clock voltages in the imaging section alternate between −5 V and +5 V and in the memory section between 0 V and 10 V, which is convenient for the control circuits. If it is desirable to carry out the transport without inversion in the imaging section, for example to achieve a low charge loss during transport, the clock voltages of the imaging section may be brought to the same levels as the clock voltages in the memory section, so to 0 V and 10 V. It is also possible to maintain the clock voltages in the imaging section at −5 V and +5 V and to reduce the voltage at the p-type interposed region 5 temporarily to, for example, 0 V during frame transport, as a result of which the −5 V voltage is insufficiently low for inversion.

In the embodiment described here, four different voltage levels are used for the gates 6: −5 V, 0 V, +5 V and 10 V. FIGS. 4f and 4g show an embodiment in which the gate voltages in the imaging section alternate between 0 V and 10 V, so between the same values as the gate voltages in the memory section, so that no more than two voltage levels can suffice. It is assumed that the composition of the device as regards, for example, doping concentrations and thicknesses of the various regions and layers has not changed relative to the previous embodiment. A voltage of 10 V is applied to the p-type interposed region 5. A voltage of 0 V is applied to the gates 6 of the imaging section A during the integration period $T_i$, so that a potential profile arises in the CCD channel 4 with wells and barriers in which generated charge can be stored in the form of electron packages. Since there is a potential difference of 10 V between the p-region 5 and the gates 6 in the imaging section, the entire or at least substantially the entire surface in the imaging section will be in the inverted state at a threshold voltage of 9 V in the more highly doped n-zones 14. The information stored in the memory section is transported to the output register by the 2-phase clock voltages of FIGS. 4c and 4d. The electrons are stored then below the gates to which the 10 V voltage is applied. The subjacent portion of the surface is not inverted at this voltage. When a voltage pulse of 35 V is applied to the substrate for the purpose of charge reset, the charge stored in the imaging section is drained off through the substrate in the manner described with reference to FIG. 3. Since the charge is stored in potential wells induced below the gates to which 10 V is applied (FIG. 4d) in the memory section, which wells are substantially deeper than those in the imaging section owing to the fact that the surface is not inverted in those locations in the memory section, the charge is not drained off in the memory section. Clock voltages of 0 and 10 V are applied to the gates 6 of the imaging section A and the memory section B during the transport period. $T_t$. The surface can become inverted at the 0 V voltage level, so that a reduction of the leakage current can be obtained also during transport. After transport, when the imaging section is empty and all charge packages have been stored in the memory section, the gates of the imaging section are set for 0 V again so that an image can be captured again in the imaging section, with or without a preceding charge reset.

A third method of selectively removing charge from the imaging section by means of the substrate voltage is depicted diagrammatically in FIG. 5. In this Figure, a portion of the memory section is shown in a cross-section transverse to the charge transport direction. The principle of the imaging section is identical to that of the imaging section in the previous embodiments, i.e. its cross-section is as shown in FIG. 2. The p-type interposed region 5, at least the portion thereof situated below the CCD channels 4, has a substantially uniform thickness without the constrictions 8 in the imaging section. The result of this uniform thickness of the layer 5 is that the potential barrier between the zones 4 and the substrate 3 in the memory section is higher than in the imaging section owing to the difference in the doping concentration per $cm^2$ during operation, when the layer 5 is fully depleted below the zones 4. The higher potential barrier below the gates of the memory section renders it possible to maintain a sufficient barrier in the case of a substrate pulse for preventing the removal of charge to the substrate, while the lower barrier in the imaging section disappears entirely or at least substantially entirely, so that charge present locally flows to the substrate. In this manner the information in the memory section can be protected also when voltages are applied to the gates in the memory section such that inversion takes place at the surface also in this section. This method may also be combined, however, with the methods described above in which higher voltages were applied to the gates of the memory section below which charge was stored than to corresponding gates of the imaging section. This leads inter alia to the advantage that the risk of charge losses in the memory section during a positive substrate pulse is further reduced.

In the embodiment described here, the charge reset pulse is applied to the substrate at a fixed potential at the p-type interposed zone 5. In some versions, for example when peripheral electronics are integrated with the imaging device on the same crystal, it may be advantageous to apply the reset pulse to the interposed zone 5 instead of to the substrate in order to reduce the barrier between substrate and CCD channel. To obtain the desired selectivity in the charge removal, it is possible to make use of differences in voltages applied to the charge storage gates of the imaging section on the one hand and of the memory section on the other hand. It is also possible to apply different voltages to the portions of the p-type interposed zone 5 in the imaging section and the memory section, owing to the comparatively high resistance in this zone. The more highly doped channel-interrupting p-type surface zone in the zone 5 may be advantageously provided with an interruption at the boundary between the imaging section and the memory section in that case.

It will be obvious that the invention is not limited to the embodiments described here, but that many more variations are possible to those skilled in the art within the scope of the invention. Thus the desired selectivity in charge removal may also be obtained in that the n-concentration in the memory section is chosen to be different from that in the imaging section. The conductivity types of the various zones and regions in the semiconductor body may also be reversed, in which case obviously the polarities of the various voltages should also be reversed. It is also possible to carry out charge reset selectively in, for example, the memory section only or the output register without removing the charge in the imaging section in that different voltages are applied to the gates of the imaging section and the memory section. The invention may also be advantageously applied to other charge-coupled imaging devices which are known per se instead of to the aging device described here. The invention is applicable not only to imaging devices, but to all types of charge-coupled devices with charge reset in which the surface is brought into the inverted state in order to reduce the leakage current.

We claim:

1. A charge-coupled imaging device of the buried-channel type, comprising a substrate of a first conductivity type which is provided at a surface with a plurality of zones of the first conductivity type separated from the substrate of the first conductivity type by an interposed zone of the second conductivity type opposite to the first, said zones of the first conductivity type forming buried channels of a first number of registers of a two-dimensional imaging section situated next to one another in which a pattern of charge packets corresponding to a radiation image projected on the device can be generated during an integration period, a second number of registers situated next to one another and forming a memory section for the temporary storage of a pattern of charge packets generated in the imaging section, and a read-out register having parallel inputs connected to the registers of the memory section, the memory section being situated between the imaging section and the read-out register, the surface being provided with a system of clock electrodes for applying clock voltages and being separated from the surface by an interposed dielectric layer and being connected to a voltage source by means of which voltages are applied, an inversion layer of the second conductivity type being formed below the system of electrodes at the interface between the dielectric layer and the buried channels in at least the imaging section during the integration period, charge reset means for draining off charge from charge storage locations in the imaging section through the substrate by the application of a voltage pulse, said charge reset means comprising a pulse voltage source connected to at least one of the substrate and the interposed zone, and means for draining off charge through the substrate from only the imaging section and simultaneously preventing charge from being drained off through the substrate from storage locations in the memory section.

2. A charge-coupled device as claimed in claim 1, characterized in that the electrode systems of the imaging section and of the memory section are each connected to a clock voltage source for applying clock voltages, the clock voltages applied to the electrodes of the imaging section during the integration period being lower in the case of an n-channel device or higher in the case of a p-channel device than the corresponding clock voltages applied to the electrodes of the memory section.

3. A charge-coupled device as claimed in claim 1, characterized in that the electrode systems of the imaging section and of the memory section are each connected to a voltage source for applying clock voltages, the clock voltages applied to the electrodes of the imaging section during the integration period having the same amplitudes as the clock voltages applied to the memory section except during those periods in which a reset pulse is applied between the substrate and the interposed zone, during which periods a voltage is applied to the electrodes of the memory section below which a charge package is stored and at which no inversion occurs at the surface.

4. A charge-coupled device as claimed in claim 1, characterized in that a minimum value of the doping concentration per unit area of the interposed zone of the second conductivity type below the buried-channel registers in the memory section is higher than that below the buried-channel registers in the imaging section.

5. A charge-coupled device as claimed in claim 1, characterized in that the reset pulse is supplied to the substrate in a period lying between reading-out of a last charge package of a first line of charge packages by the read-out register and reading-out of a first charge package of a second line of charge packages following said first line.

* * * * *